(12) United States Patent
Mao

(10) Patent No.: US 10,333,492 B2
(45) Date of Patent: Jun. 25, 2019

(54) DELAY COMPENSATION APPARATUS

(71) Applicant: HUAWEI TECHNOLOGIES CO., LTD., Shenzhen, Guangdong (CN)

(72) Inventor: Hongliang Mao, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 96 days.

(21) Appl. No.: 15/625,373

(22) Filed: Jun. 16, 2017

(65) Prior Publication Data

US 2017/0288640 A1    Oct. 5, 2017

Related U.S. Application Data

(63) Continuation of application No. PCT/CN2014/094392, filed on Dec. 19, 2014.

(51) Int. Cl.
*H03H 9/42*     (2006.01)
*H03K 19/0175*  (2006.01)
*H03H 9/02*     (2006.01)

(52) U.S. Cl.
CPC ........ *H03H 9/423* (2013.01); *H03H 9/02818* (2013.01); *H03K 19/0175* (2013.01)

(58) Field of Classification Search
CPC ............ H01P 1/10; H03H 7/01; H03H 11/04; H03H 9/64; H03H 15/00; H03H 9/42
USPC ........................................ 333/101, 103, 166
See application file for complete search history.

(56) References Cited

U.S. PATENT DOCUMENTS

| | | | |
|---|---|---|---|
| 4,013,834 A * | 3/1977 | Kino | H04N 5/211 310/313 B |
| 4,583,047 A | 4/1986 | Le Goff èspouse Hènaff et al. | |
| 4,748,364 A * | 5/1988 | Mitsutsuka | H03H 9/14558 310/313 D |
| 4,752,750 A * | 6/1988 | Zimmerman | H03H 15/00 333/166 |
| 5,387,887 A * | 2/1995 | Zimmerman | H03H 9/6403 333/166 |
| 5,757,318 A | 5/1998 | Reudink | |
| 5,828,699 A | 10/1998 | Heinemann | |
| 6,492,884 B1 * | 12/2002 | Kosinski | H03H 9/6403 310/313 R |

(Continued)

FOREIGN PATENT DOCUMENTS

| | | |
|---|---|---|
| CN | 101232298 A | 7/2008 |
| CN | 101427926 A | 5/2009 |
| CN | 101674589 A | 3/2010 |

(Continued)

OTHER PUBLICATIONS

Extended European Search Report dated Dec. 8, 2017 in corresponding European Patent Application No. 14908249.7.

(Continued)

*Primary Examiner* — Dean O Takaoka
(74) *Attorney, Agent, or Firm* — Staas & Halsey LLP

(57) ABSTRACT

A delay compensation apparatus is provided, where a surface acoustic wave component is used as a main delay component for delay compensation. A size of the surface acoustic wave component is relatively small. Therefore, the delay compensation apparatus provided in embodiments of the present invention features a relatively small size and a relatively high device integration level.

9 Claims, 10 Drawing Sheets

(56) References Cited

U.S. PATENT DOCUMENTS 6,683,515 B1 1/2004 Nakamura et al.
2012/0313675 A1 12/2012 Oh

FOREIGN PATENT DOCUMENTS

CN 102571031 A 7/2012
CN 103457596 A 12/2013

OTHER PUBLICATIONS

International Search Report dated Sep. 23, 2015 in corresponding International Application No. PCT/CN2014/094392.
International Search Report dated Sep. 23, 2015 in corresponding International Patent Application No. PCT/CN2014/094392.
Changbao et al., "Delay Time Compensation Scheme for Surface Acoustic Wave's Wavelet Reconstruction Device Based on Multistrip Coupler", Journal of Xi''an Jiaotong University, vol. 40, No. 8, Aug. 2006, 5 pages.
Chinese Office Action dated Sep. 19, 2018 in corresponding Chinese Patent Application No. 201480077420.8, 5pgs.

\* cited by examiner

DELAY COMPENSATION APPARATUS

CROSS-REFERENCE TO RELATED APPLICATIONS

This application is a continuation of International Application No. PCT/CN2014/094392, filed on Dec. 19, 2014, the disclosure of which is hereby incorporated by reference in its entirety.

TECHNICAL FIELD

The present invention relates to the field of communications technologies, and in particular, to a delay compensation apparatus.

BACKGROUND

Currently, multi-channel transmission of a signal is used in many application scenarios, and delays of output signals of multiple channels need to be consistent. For example, in a microwave communications system, a space diversity reception technology is usually used to cope with multipath fading. That is, two receive antennas, a main antenna and a diversity antenna, are disposed to independently receive a same signal. The signal received by the main antenna and the signal received by the diversity antenna are combined as one signal after delay alignment and other processing are performed on the signals. Then, a subsequent step such as demodulation is performed. That is, during microwave communication, a delay of an output signal from a receive channel of the main antenna and a delay of an output signal from a receive channel of the diversity antenna need to be consistent.

In the prior art, after an input signal delay difference between channels is detected, delay compensation is usually performed in a manner of manually connecting a cable of a corresponding length. For example, as shown in FIG. 1, on a first channel Ch1 and a second channel CH2, a delay of an input signal to the first channel Ch1 is less than a delay of an input signal to the second channel CH2. Therefore, a cable needs to be connected to the first channel CH1 to increase a delay of a signal transmitted on the first channel CH1, so that a delay of an output signal from the first channel CH1 and a delay of an output signal from the second channel CH2 are consistent.

However, in the solution in which delay compensation is performed by manually connecting a cable, not only a relatively high requirement is imposed on a technical level of implementation personnel, a device integration level is also relatively low because of a relatively large size of additionally connected cables.

SUMMARY

Embodiments of the present invention provide a delay compensation apparatus to improve a device integration level.

According to a first aspect, a delay compensation apparatus is provided, including a first channel delay unit and a second channel delay unit, where the first channel delay unit is serially connected on a first channel, the second channel delay unit is serially connected on a second channel, and a delay of an input signal to the first channel is less than a delay of an input signal to the second channel, where:

the first channel delay unit includes a surface acoustic unit, and the surface acoustic unit includes a first surface acoustic wave component and a surface acoustic output selection switch; the first surface acoustic wave component includes an input end and p output ends, where p≥2; signal delay differences between the p output ends of the first surface acoustic wave component and the input end of the first surface acoustic wave component form an arithmetic progression whose first term is absolute delay duration $T_0$ and whose common difference is relative delay duration $t_0$; the input end of the first surface acoustic wave component is used as a signal input end of the surface acoustic unit, and the surface acoustic output selection switch selects one output end of the p output ends of the first surface acoustic wave component as a signal output end of the surface acoustic unit; and delay duration of the second channel delay unit is the absolute delay duration $T_0$.

BRIEF DESCRIPTION OF DRAWINGS

The drawings are provided to facilitate further understanding of the present invention, and they constitute a part of the application. The drawings, along with the embodiments of the present invention, are used to explain the present invention, and pose no limitation on the present invention. In the drawings.

DESCRIPTION OF EMBODIMENTS

To provide an implementation solution for improving a device integration level, embodiments of the present invention provide a delay compensation apparatus. The following describes the embodiments of the present invention with reference to the accompanying drawings of the specification. It should be understood that, the embodiments described herein are used merely to describe and explain the present invention, but are not used to limit the present invention. In addition, the embodiments in this application and features in the embodiments may be mutually combined provided that no conflict is caused.

Figure 1:
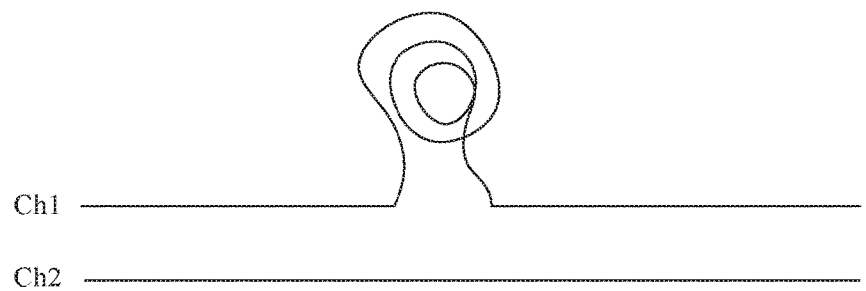
FIG. 1 is a schematic diagram of a delay compensation solution in the prior art.
Figure 2:
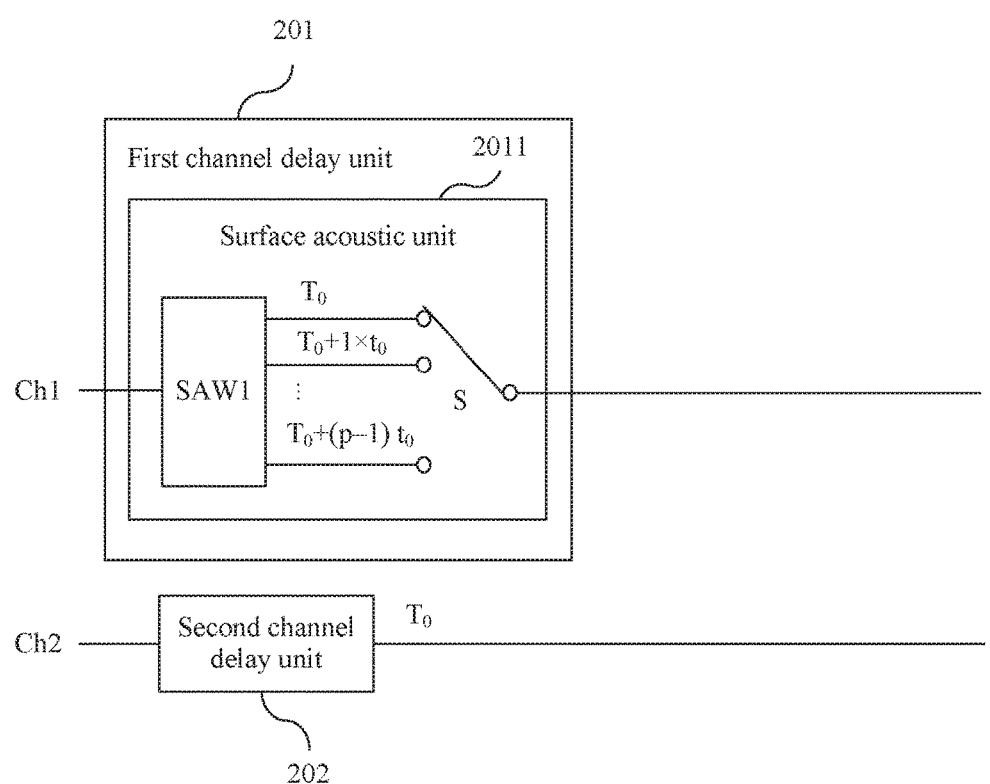
FIG. 2 is a first schematic diagram of a delay compensation apparatus according to an embodiment of the present invention.

An embodiment of the present invention provides a delay compensation apparatus, which, as shown in FIG. 2, may specifically include a first channel delay unit 201 and a second channel delay unit 202. The first channel delay unit 201 is serially connected on a first channel Ch1, the second channel delay unit 202 is serially connected on a second channel Ch2, and a delay of an input signal to the first channel Ch1 is less than a delay of an input signal to the second channel Ch2.

The first channel delay unit 201 includes a surface acoustic unit 2011, and the surface acoustic unit 2011 includes a first surface acoustic wave component SAW1 and a surface acoustic output selection switch S. The first surface acoustic wave component SAW1 includes an input end and p output ends, where p≥2. Signal delay differences between the p output ends of the first surface acoustic wave component SAW1 and the input end of the first surface acoustic wave component SAW1 form an arithmetic progression whose first term is absolute delay duration $T_0$ and whose common difference is relative delay duration $t_0$. The input end of the first surface acoustic wave component SAW1 is used as a signal input end of the surface acoustic unit 2011, and the surface acoustic output selection switch S selects one output end of the p output ends of the first surface acoustic wave component SAW1 as a signal output end of the surface acoustic unit 2011. The signal input end and the signal output end of the surface acoustic unit 2011 are respectively used as a signal input end and a signal output end of the first channel delay unit 201.

Delay duration of the second channel delay unit 202 is the absolute delay duration $T_0$.

The signal delay differences between the p output ends of the first surface acoustic wave component SAW1 and the input end of the first surface acoustic wave component SAW1 form an arithmetic progression whose first term is the absolute delay duration $T_0$ and whose common difference is the relative delay duration $t_0$. That is, in an ascending progression formed by the signal delay differences between the p output ends of the first surface acoustic wave component SAW1 and the input end of the first surface acoustic wave component SAW1, the first term is the absolute delay duration $T_0$, and starting from the second term, a difference between each term and a term prior to the term is equal to the relative delay duration $t_0$.

Figure 3:
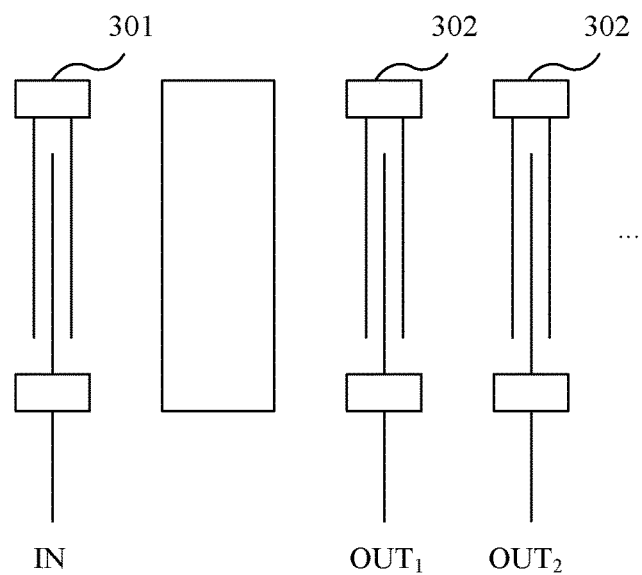
FIG. 3 is a first schematic diagram of a first surface acoustic wave component according to an embodiment of the present invention.

In this embodiment of the present invention, a structural principle of the first surface acoustic wave component SAW1 used in the surface acoustic unit 2011 is shown in FIG. 3. The first surface acoustic wave component SAW1 has an input transducer 301 and multiple output transducers 302, where an input end IN of the input transducer 301 is the input end of the first surface acoustic wave component SAW1, and the input transducer 301 converts an input electrical signal into an acoustic signal (a surface acoustic wave). The acoustic signal arrives at an output transducer 302 after being transmitted on a medium for a specific distance, and the output transducer 302 converts the acoustic signal into an electrical signal and outputs the electrical signal. Distances from the input transducer 301 to the multiple output transducers 302 increase step by step; therefore, signal delay differences between output ends of the multiple output transducers 302 and the input end of the input transducer 301 also increase step by step. A signal delay difference between the input end of the input transducer 301 and an output end $OUT_1$ of an output transducer nearest to the input transducer 301 is the absolute delay duration $T_0$, and signal delay differences corresponding to output ends $OUT_2$ and the like of other output transducers increase by 1/f in sequence, where f is a center working frequency of the first surface acoustic wave component SAW1.

Therefore, the output end of each output transducer of the first surface acoustic wave component SAW1 may be used as an output end of the first surface acoustic wave component SAW1. Therefore, the signal delay differences between the p output ends of the first surface acoustic wave component SAW1 and the input end of the first surface acoustic wave component SAW1 form an arithmetic progression whose first term is the absolute delay duration $T_0$ and whose common difference is 1/f.

For example, to reduce insertion losses and in-band ripples, in the first surface acoustic wave component SAW1, output ends of every k output transducers except the output transducer nearest to the input transducer 301 may be connected, and a wiring terminal of the connection is used as an output end of the first surface acoustic wave component SAW1. Therefore, the signal delay differences between the p output ends of the first surface acoustic wave component SAW1 and the input end of the first surface acoustic wave component SAW1 form an arithmetic progression whose first term is the absolute delay duration $T_0$ and whose common difference is k/f, where k is an integer greater than 1.

Figure 4:
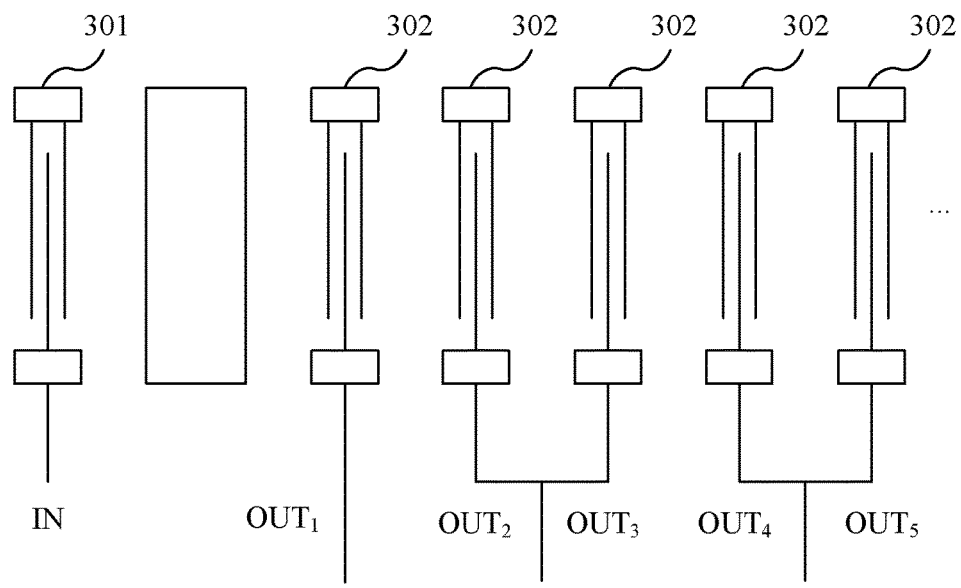
FIG. 4 is a second schematic diagram of a first surface acoustic wave component according to an embodiment of the present invention.

For example, as shown in FIG. 4, the signal delay differences between the p output ends of the first surface acoustic wave component SAW1 and the input end of the first surface acoustic wave component SAW1 form an arithmetic progression whose first term is the absolute delay duration $T_0$ and whose common difference is 2/f.

In summary, a step-by-step delay feature of the multiple output ends of the first surface acoustic wave component SAW1 can be implemented, where step-by-step delay duration is the relative delay duration $t_0$; and $$t_0 = a/f;$$

where a is an integer greater than or equal to 1.

Apparently, when the surface acoustic output selection switch S selects a different output end of the first surface acoustic wave component SAW1 as the signal output end of the surface acoustic unit 2011, delay duration of the surface acoustic unit 2011 is different, and an amount of compensation, by the first channel delay unit 201, to a signal transmitted on the first channel Ch1 is also different. By using the delay compensation apparatus shown in FIG. 2, delay compensation of a step of $t_0$ can be implemented, where a maximum delay compensation value is $(p-1)t_0$. When the relative delay duration $t_0$ is relatively small, delay compensation of a relative small step can be implemented; or when the relative delay duration $t_0$ is relatively large, delay compensation of a relative large step can be implemented.

The foregoing absolute delay duration $T_0$ represents an absolute delay of the first surface acoustic wave component SAW1, and also represents an absolute delay of the first channel delay unit 201. The absolute delay duration $T_0$ is generally relatively large and is about 0.5 us. Therefore, the second channel delay unit 202 whose delay duration is the absolute delay duration $T_0$ needs to be set, to increase a delay of a signal transmitted on the second channel Ch2 by the absolute delay duration $T_0$, so as to cancel the absolute delay of the first channel delay unit 201. Apparently, a part that is in delay duration of the first channel delay unit 201 and that exceeds the absolute delay duration $T_0$ is the amount of compensation to the signal transmitted on the first channel Ch1.

In actual implementation, the second channel delay unit 202 may be specifically implemented in multiple manners, for example, by using a delay line.

Figure 5:
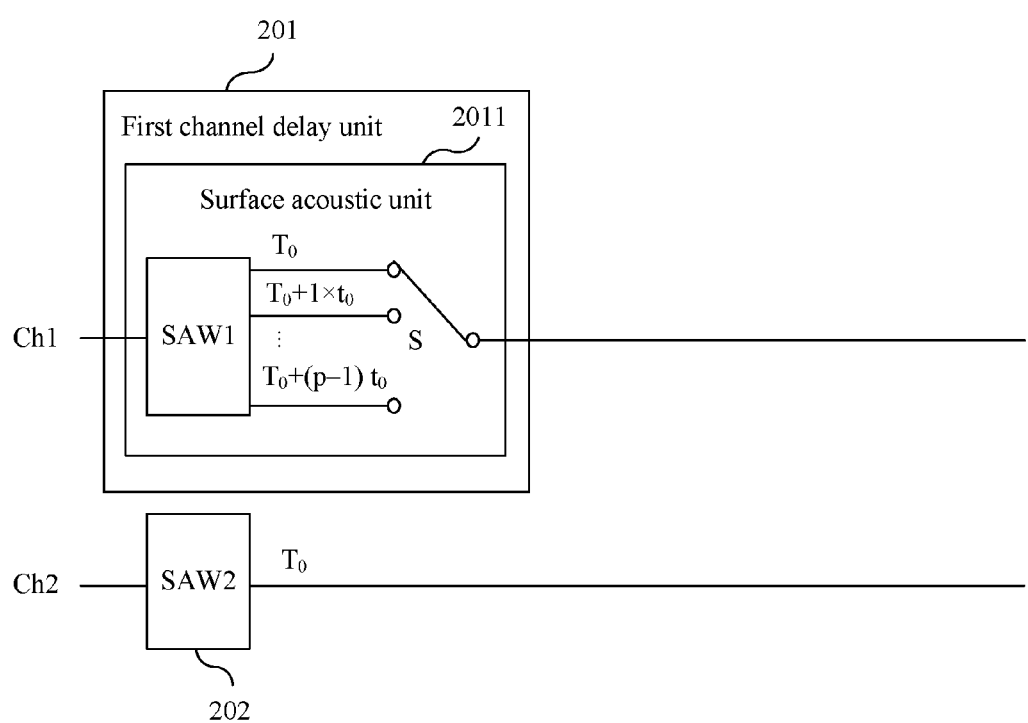
FIG. 5 is a second schematic diagram of a delay compensation apparatus according to an embodiment of the present invention.

For example, corresponding to the implementation manner of the first channel delay unit 201, the second channel delay unit 202 may also be implemented by using a surface acoustic wave component. That is, as shown in FIG. 5, the second channel delay unit 202 may be a second surface acoustic wave component SAW2. The second surface acoustic wave component SAW2 includes an input end and an output end, where a signal delay difference between the output end of the second surface acoustic wave component SAW2 and the input end of the second surface acoustic wave component SAW2 is the absolute delay duration $T_0$, and the input end and the output end of the second surface acoustic wave component SAW2 are respectively used as a signal input end and a signal output end of the second channel delay unit 202.

Figure 6:
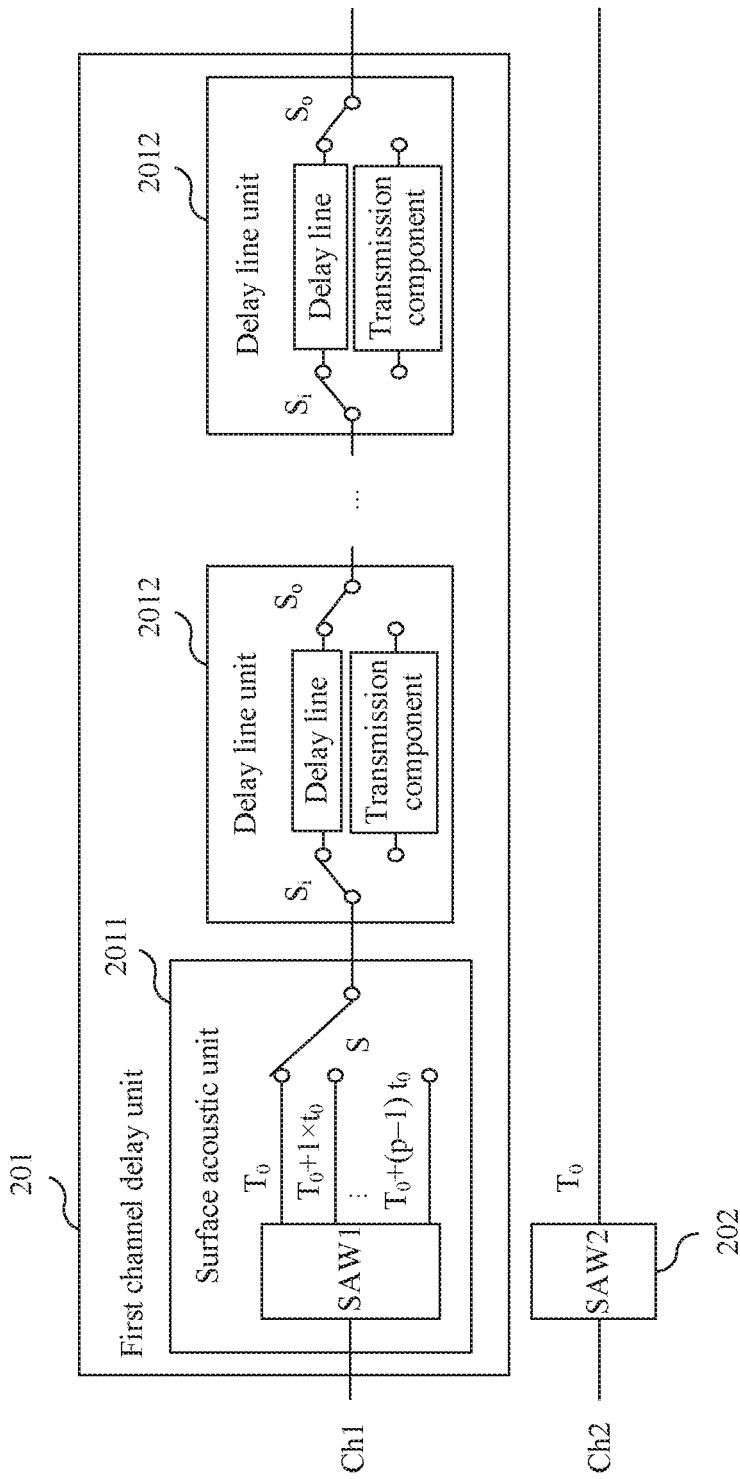
FIG. 6 is a third schematic diagram of a delay compensation apparatus according to an embodiment of the present invention.

Further, the first channel delay unit 201 may further include q delay line units 2012. As shown in FIG. 6, the surface acoustic unit 2011 is serially connected to the q delay line units 2012, and two ends of the serial connection are respectively used as the signal input end and the signal output end of the first channel delay unit 201; and each delay line unit 2012 includes a delay line, a transmission component, an input selection switch $S_i$, and an output selection switch $S_o$, where the input selection switch $S_i$ selects one end of the delay line or one end of the transmission component as a signal input end of the delay line unit 2012, the output selection switch $S_o$ selects another end of the delay line or another end of the transmission component as a signal output end of the delay line unit 2012, and delay duration of the transmission component is less than specified duration.

The foregoing specified duration may be determined according to a compensation magnitude of the delay compensation apparatus and a requirement on delay compensation accuracy in an actual application scenario. For example, in this embodiment of the present invention, the compensation magnitude of the delay compensation apparatus is an ns level, and the specified duration may be set to a value less than 0.5 ns. A smaller specified duration means higher delay compensation accuracy. Under an ideal circumstance, the delay duration of the transmission component is 0.

Figure 7:
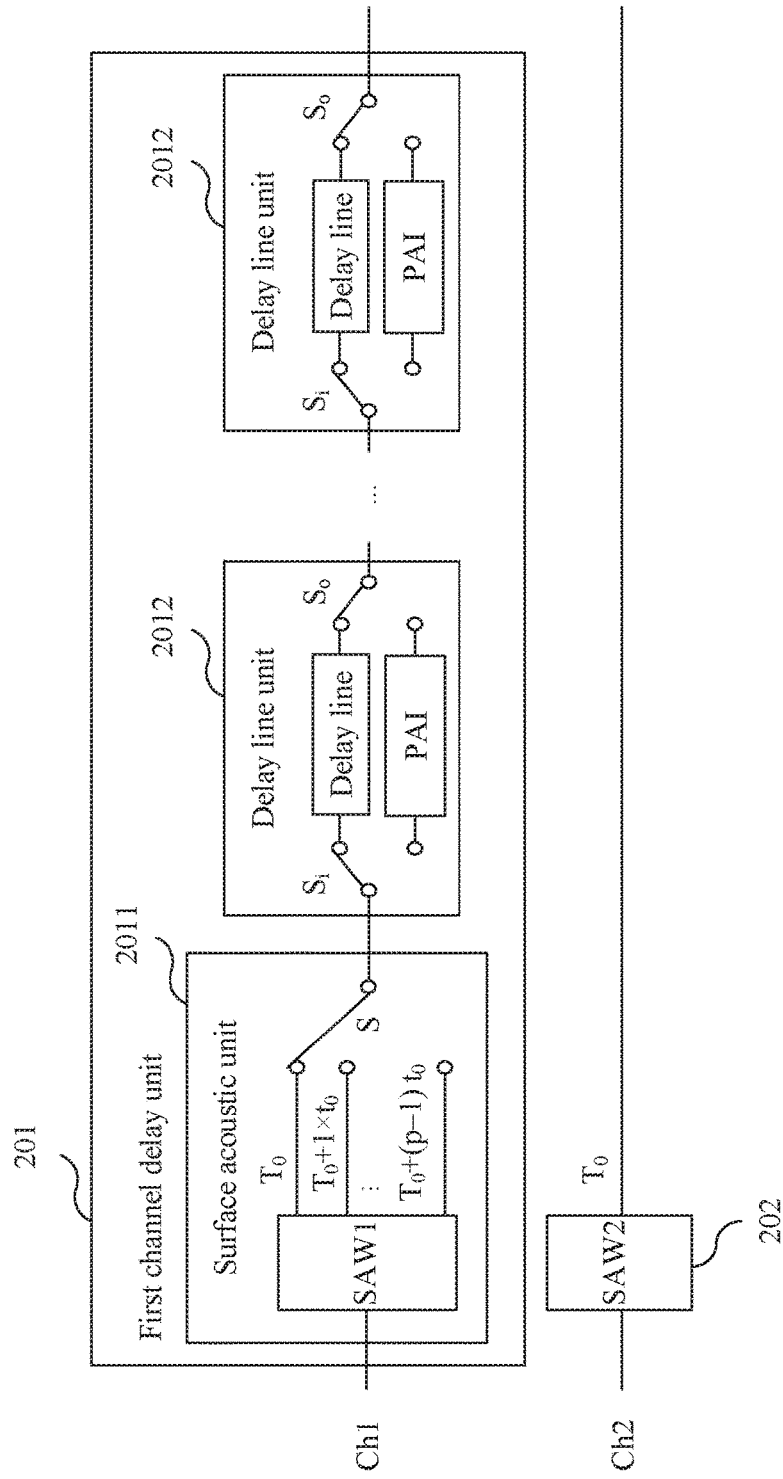
FIG. 7 is a fourth schematic diagram of a delay compensation apparatus according to an embodiment of the present invention.

Further, the transmission component may be specifically selected according to an actual requirement, and may be, for example, a transmission line. For example, as shown in FIG. 7, the transmission component may be specifically a resistance attenuator PAI that can balance an insertion loss of the delay line.

The input selection switch $S_i$ and the output selection switch $S_o$ may be used to select to connect the delay line in the delay line unit 2012 to the first channel Ch1 or connect the transmission component in the delay line unit 2012 to the first channel Ch1, so as to adjust delay duration of the first channel delay unit 201. This can implement delay compensation of a relatively small step when the relative delay duration $t_0$ of the first surface acoustic wave component SAW1 is relatively large.

Figure 8:
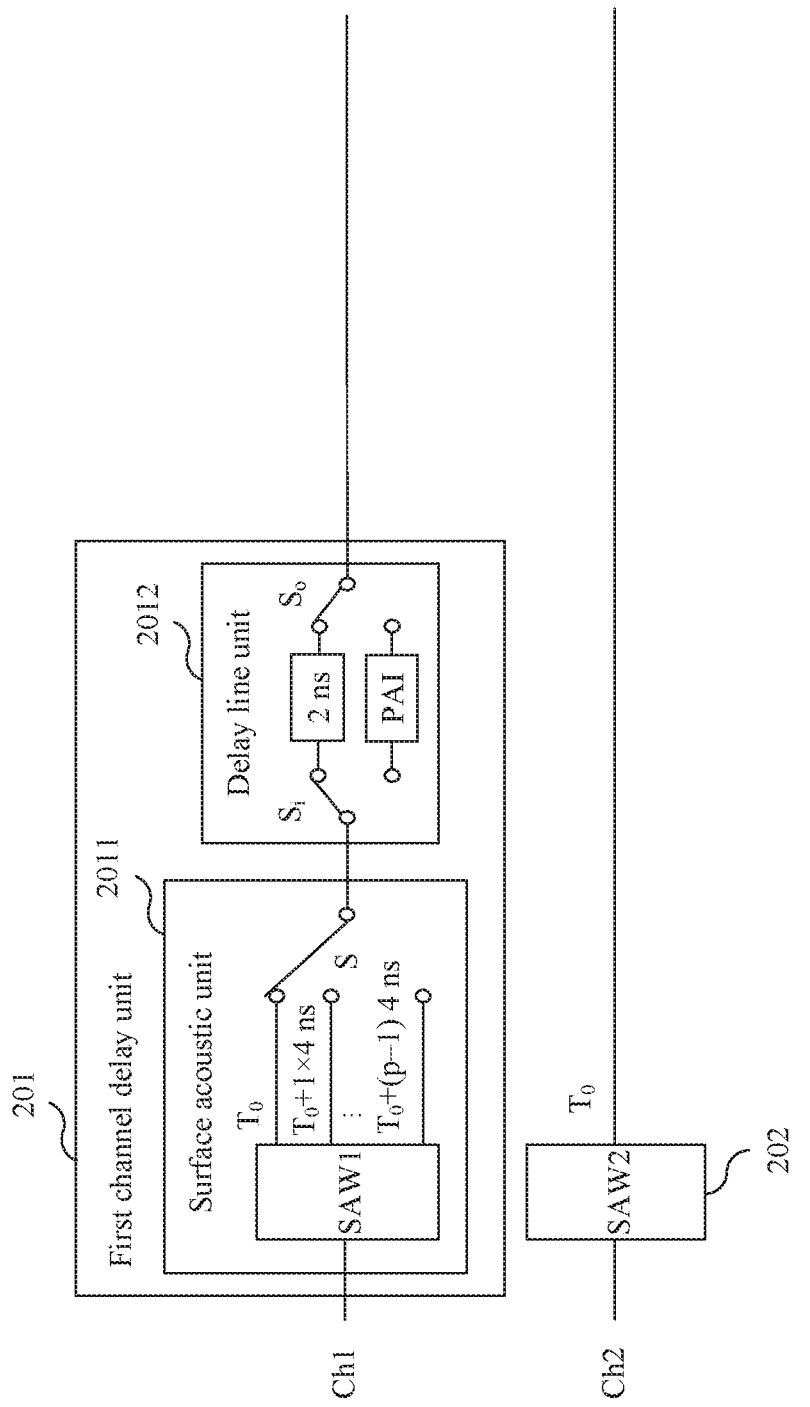
FIG. 8 is a fifth schematic diagram of a delay compensation apparatus according to an embodiment of the present invention.

For example, when the relative delay duration $t_0$ of the first surface acoustic wave component SAW1 in the surface acoustic unit 2011 is 4 ns, delay compensation of a step of 4 ns can be implemented by using the delay compensation apparatus shown in FIG. 2. However, if a delay compensation apparatus shown in FIG. 8 is used, when a delay line unit with a delay line whose delay duration is 2 ns is disposed in the first channel delay unit 201, delay compensation of a step of 2 ns can be implemented.

A quantity q of delay line units 2012 and delay duration of a delay line in the delay line units 2012 may be specifically determined according to a requirement on step-by-step delay compensation in an actual application scenario.

For example, the quantity q of delay line units 2012 may be determined based on the following formula, to implement delay compensation of duration in a unit of a step:

$q=\text{ceil}(\log_2 t_0)$.

Further, a sum t of delay duration of delay lines in the q delay line units 2012 is:

$t=\text{ceil}(t_0)-1$.

Specifically, delay duration $t_1$ of a delay line in an $i^{th}$ delay line unit 2012 of the q delay line units 2012 is:

$t_i = 2^{i-1}$, where $1 \leq i \leq q-1$; or $t_i = t-(t_1+t_2+\ldots+t_{q-1})$, where $i=q$.

For example, when the relative delay duration $t_0$ of the first surface acoustic wave component SAW1 in the surface acoustic unit 2011 is 4 ns, the following is obtained by means of calculation according to the foregoing formulas:

$q=\text{ceil}(\log_2 4)=2$;

$t=\text{ceil}(4)-1=3$ ns;

$t_1=2^{1-1}=1$ ns; and $t_2=3-1=2$ ns.

Figure 9:
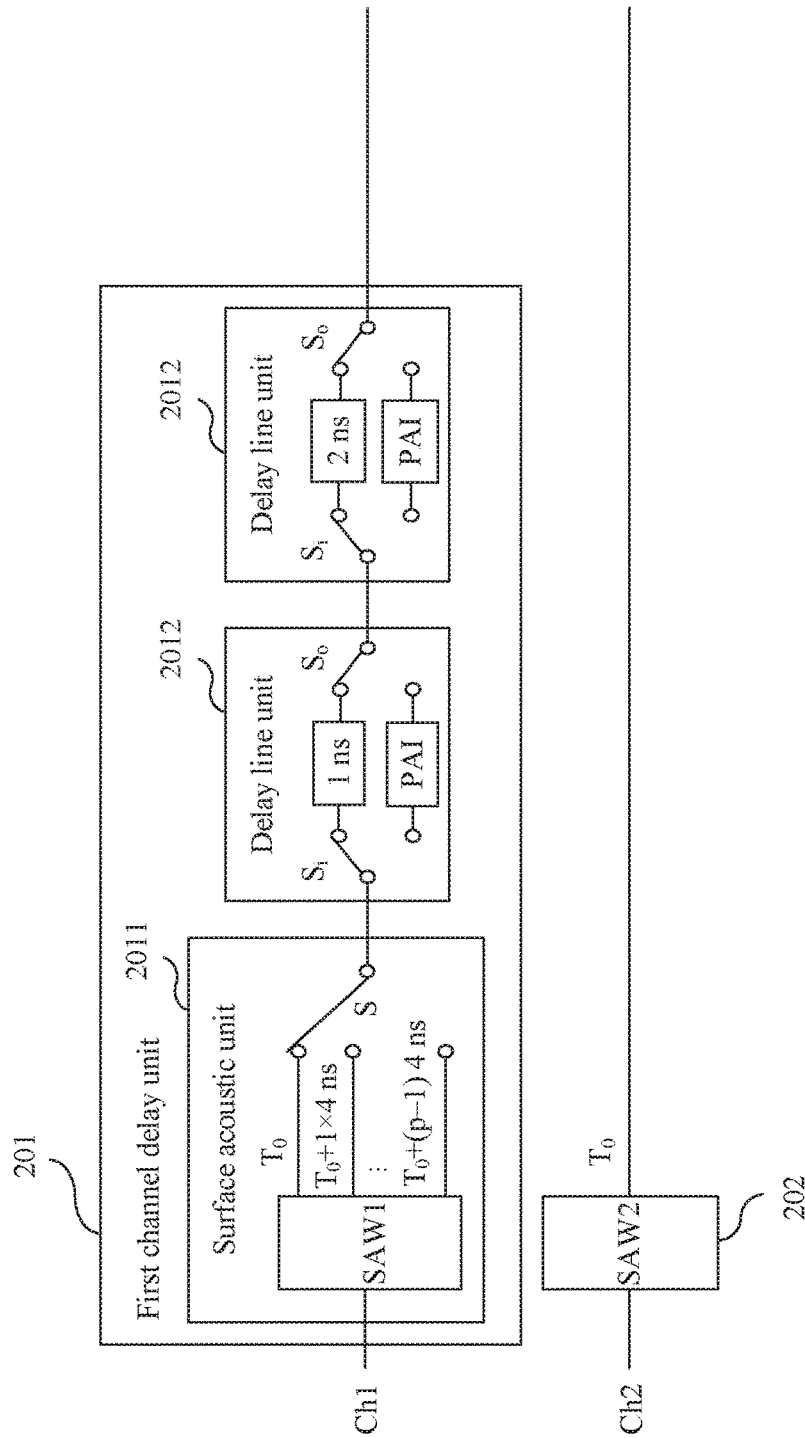
FIG. 9 is a sixth schematic diagram of a delay compensation apparatus according to an embodiment of the present invention.

A delay compensation apparatus constructed based on the foregoing parameters is shown in FIG. 9, delay compensation of a step of 1 ns can be implemented by disposing a delay line unit with a delay line whose delay duration is 1 ns and a delay line unit with a delay line whose delay duration is 2 ns in the first channel delay unit 201.

In an actual application scenario, an expected delay compensation range T is generally provided in advance, where $T \geq t_0$, and the quantity p of output ends of the first surface acoustic wave component SAW1 can be determined with reference to the relative delay duration $t_0$ of the first surface acoustic wave component SAW1 used in the surface acoustic unit 2011 of the first channel delay unit 201:

$p=\text{floor}(T/t_0)+1$.

For example, in a microwave communications system, for delay compensation between a receive channel of a main antenna and a receive channel of a diversity channel, an expected delay compensation range is (0-127) ns, and the center working frequency of the first surface acoustic wave component SAW1 used in the surface acoustic unit 2011 of the first channel delay unit 201 is 140 MHz, that is, the signal delay differences between the output ends of the first surface acoustic wave component SAW1 and the input end of the first surface acoustic wave component SAW1 form an arithmetic progression whose first term is the absolute delay duration $T_0$ and whose common difference is $a \times 7.1$ ns, where a is an integer greater than or equal to 1 and is specifically determined according to a specific wiring manner of the output ends of the output transducers in the first surface acoustic wave component SAW1.

Specifically, when the output end of each output transducer of the first surface acoustic wave component SAW1 may be used as an output end of the first surface acoustic wave component SAW1, that is, when the signal delay differences between the output ends of the first surface acoustic wave component SAW1 and the input end of the first surface acoustic wave component SAW1 form an arithmetic progression whose first term is the absolute delay duration $T_0$ and whose common difference is 7.1 ns, the following is obtained by means of calculation according to the foregoing formulas:

$$p=\text{floor}(127/7.1)+1=18;$$

$$q=\text{ceil}(\log_2 7.1)=3;$$

$$t=\text{ceil}(7.1)-1=7 \text{ ns};$$

$$t_1=2^{1-1}=1 \text{ ns};$$

$$t_2=2^{2-1}=2 \text{ ns; and}$$

$$t_3=7-1-2=4 \text{ ns}.$$

Figure 10:
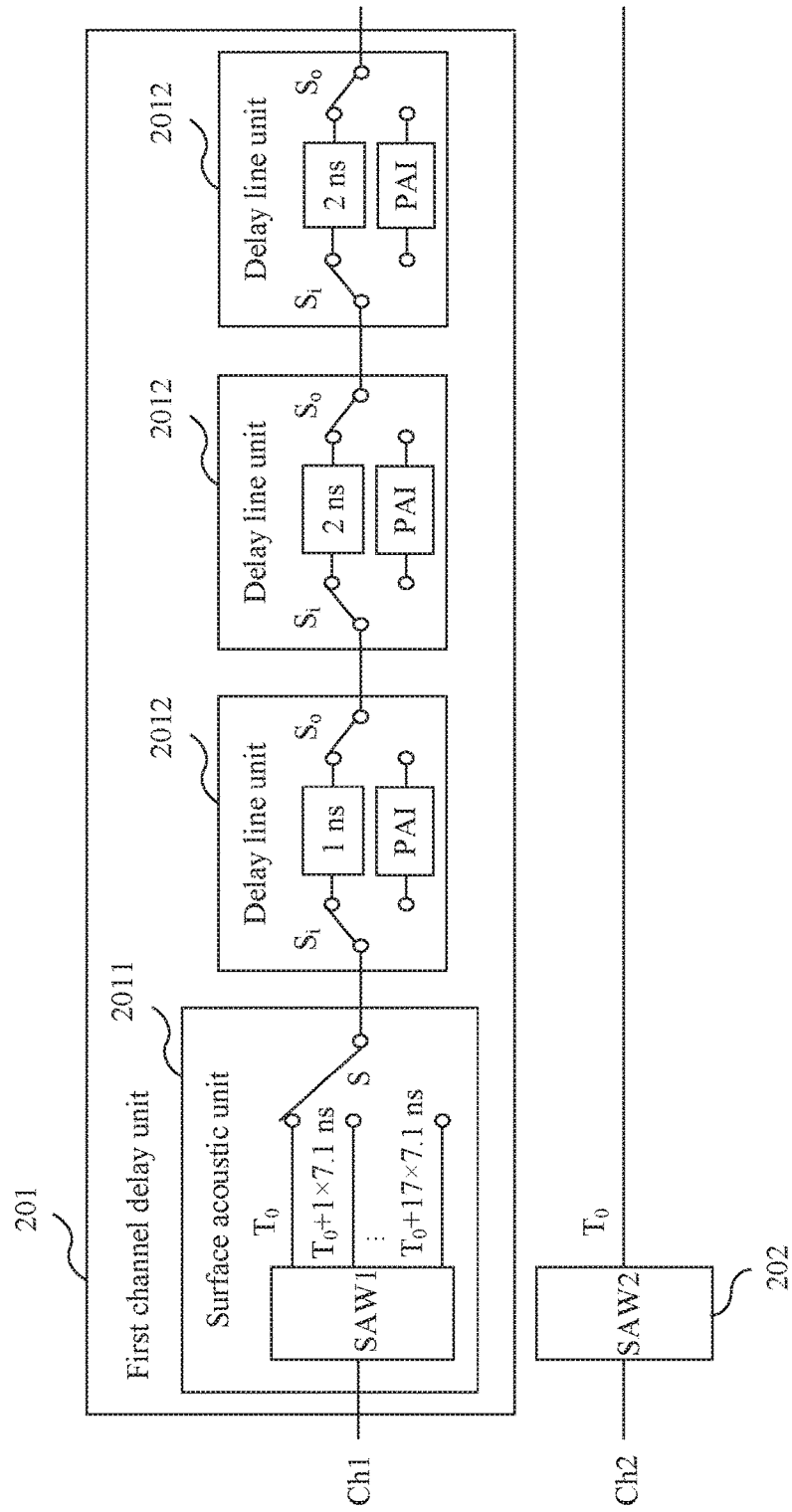
FIG. 10 is a seventh schematic diagram of a delay compensation apparatus according to an embodiment of the present invention.

A delay compensation apparatus constructed based on the foregoing parameters is shown in FIG. 10, and the apparatus can implement delay compensation of a step of 1 ns within a delay compensation range less than or equal to 127 ns.

Specifically, when in the first surface acoustic wave component SAW1, output ends of every three output transducers except the output transducer nearest to the input transducer are connected, and a wiring terminal of the connection is used as an output end of the first surface acoustic wave component SAW1, that is, when the signal delay differences between the output ends of the first surface acoustic wave component SAW1 and the input end of the first surface acoustic wave component SAW1 form an arithmetic progression whose first term is the absolute delay duration $T_0$ and whose common difference is 3×7.1 ns=21.3 ns, the following is obtained by means of calculation according to the foregoing formulas:

$$p=\text{floor}(127/21.3)+1=6;$$

$$q=\text{ceil}(\log_2 21.3)=5;$$

$$t=\text{ceil}(21.3)-1=21 \text{ ns};$$

$$t_1=2^{1-1}=1 \text{ ns};$$

$$t_2=2^{2-1}=2 \text{ ns; and}$$

$$t_3=2^{3-1}=4 \text{ ns};$$

$$t_4=2^{4-1}=8 \text{ ns; and}$$

$$t_5=21-1-2-4-8=6 \text{ ns}.$$

Figure 11:
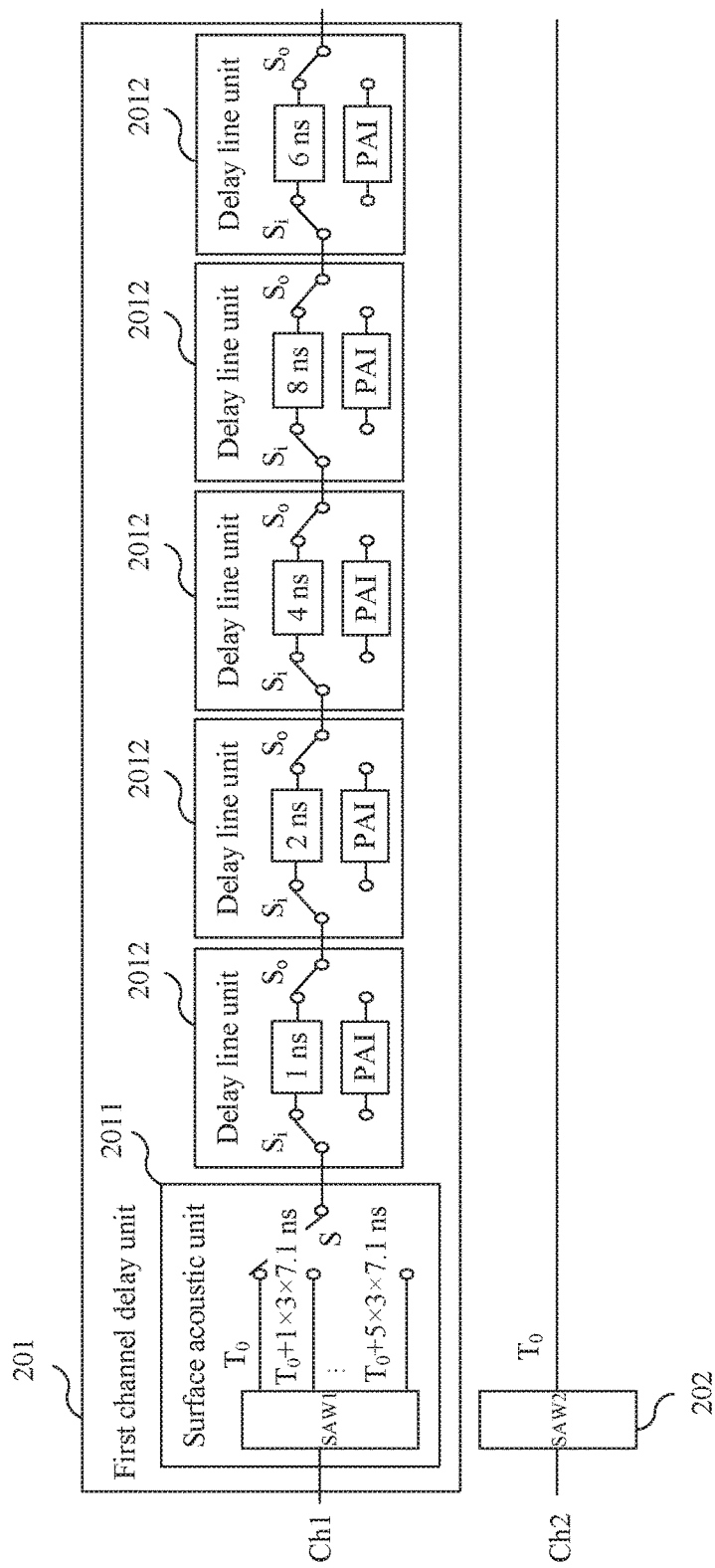
FIG. 11 is an eighth schematic diagram of a delay compensation apparatus according to an embodiment of the present invention.

A delay compensation apparatus constructed based on the foregoing parameters is shown in FIG. 11, and the apparatus can also implement delay compensation of a step of 1 ns within a delay range less than or equal to 127 ns.

Figure 12:
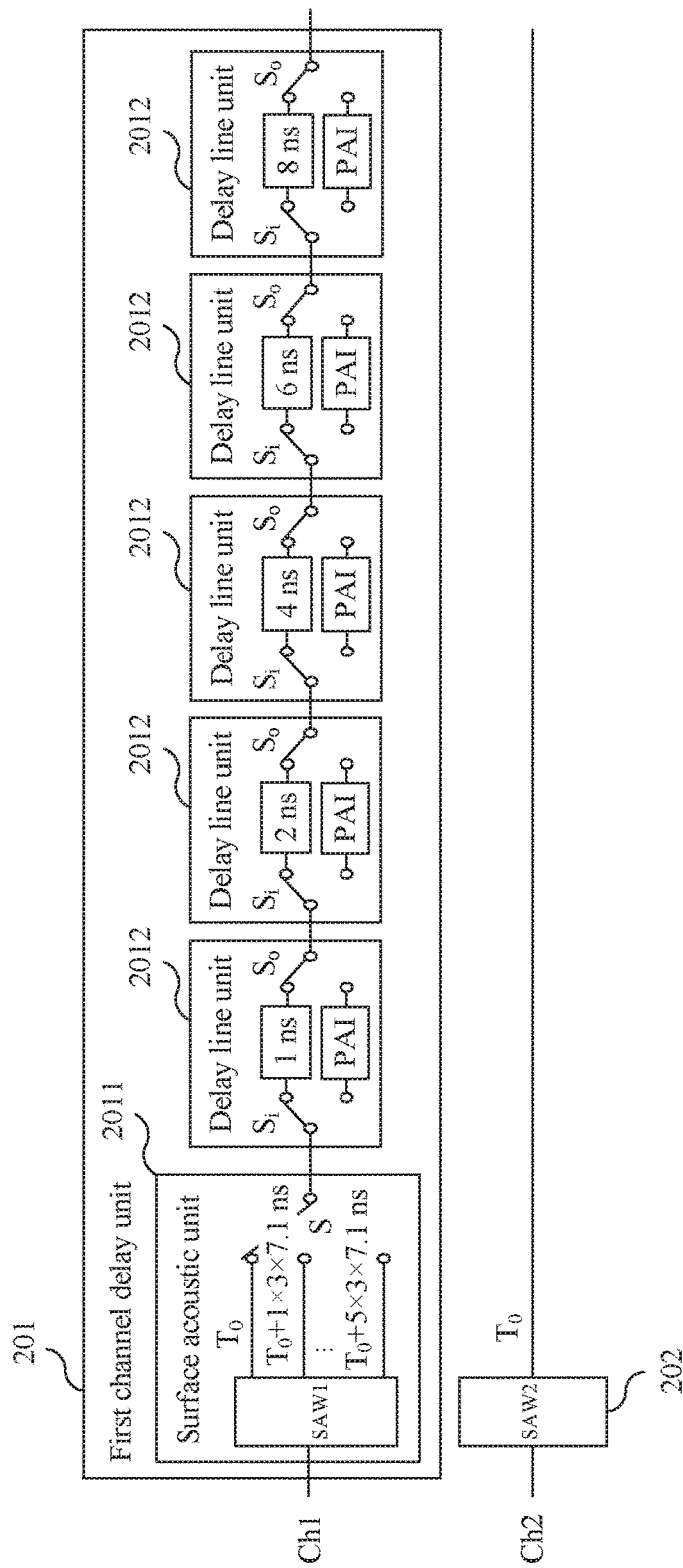
FIG. 12 is a ninth schematic diagram of a delay compensation apparatus according to an embodiment of the present invention.

It should be noted that, a serial connection sequence between the surface acoustic unit 2011 and the delay line units 2012 in the first channel delay unit 201 is not specifically limited in the present invention. For example, the delay compensation apparatus shown in FIG. 11 may be the same as a delay compensation apparatus shown in FIG. 12. Certainly, all the delay line units 2012 may be located after the surface acoustic unit 2011, or located before the surface acoustic unit 2011, or some are located after the surface acoustic unit 2011 and some are located before the surface acoustic unit 2011.

It can be learned that, because of a relatively small size of a surface acoustic wave component, the delay compensation apparatus provided in the embodiments of the present invention not only features a high device integration level and high reliability, but also can implement delay compensation of a small step within a large range, and in addition, is easy to implement and cost-effective.

Although some embodiments of the present invention have been described, persons skilled in the art can make changes and modifications to these embodiments once they learn the basic inventive concept. Therefore, the following claims are intended to be construed as to cover the embodiments and all changes and modifications falling within the scope of the present invention.

Obviously, persons skilled in the art can make various modifications and variations to the embodiments of the present invention without departing from the spirit and scope of the embodiments of the present invention. The present invention is intended to cover these modifications and variations provided that they fall within the scope of protection defined by the following claims and their equivalent technologies.

What is claimed is:

1. A delay compensation apparatus, comprising a first channel delay unit and a second channel delay unit, wherein the first channel delay unit is serially connected on a first channel, the second channel delay unit is serially connected on a second channel, and a delay of an input signal to the first channel is less than a delay of an input signal to the second channel, wherein:
   the first channel delay unit comprises a surface acoustic unit, and the surface acoustic unit comprises a first surface acoustic wave component and a surface acoustic output selection switch; the first surface acoustic wave component comprises an input end and p output ends, wherein p≥2; signal delay differences between the p output ends of the first surface acoustic wave component and the input end of the first surface acoustic wave component form an arithmetic progression whose first term is absolute delay duration $T_0$ and whose common difference is relative delay duration $t_0$;
   the input end of the first surface acoustic wave component is used as a signal input end of the surface acoustic unit, and the surface acoustic output selection switch selects one output end of the p output ends of the first surface acoustic wave component as a signal output end of the surface acoustic unit; and
   delay duration of the second channel delay unit is the absolute delay duration $T_0$.

2. The apparatus according to claim 1, wherein the first channel delay unit further comprises q delay line units, wherein the surface acoustic unit is serially connected to the q delay line units, and two ends of the serial connection are respectively used as a signal input end and a signal output end of the first channel delay unit; and
   each delay line unit comprises a delay line, a transmission component, an input selection switch, and an output selection switch, wherein the input selection switch selects one end of the delay line or one end of the transmission component as a signal input end of the delay line unit, the output selection switch selects another end of the delay line or another end of the transmission component as a signal output end of the delay line unit, and delay duration of the transmission component is less than specified duration.

3. The apparatus according to claim 2, wherein the transmission component is a resistance attenuator.

4. The apparatus according to claim 2, wherein $q=\text{ceil}(\log_2 t_0)$.

5. The apparatus according to claim 2, wherein a sum t of delay duration of delay lines in the q delay line units is:

$t=\text{ceil}(t_0)-1$.

6. The apparatus according to claim 5, wherein delay duration $t_i$ of a delay line in an $i^{th}$ delay line unit of the q delay line units is:

$t_i=2^{i-1}$, where $1 \leq i \leq q-1$; or $t_i=t-(t_1+t_2+\ldots+t_{q-1})$, where i=q.

7. The apparatus according to claim 1, wherein $t_0=a/f$, wherein a is an integer greater than or equal to 1, and f is a center working frequency of the first surface acoustic wave component.

8. The apparatus according to claim 1, wherein $p=\text{floor}(T/t_0)+1$;

wherein T is an expected maximum compensation value, and $T \geq t_0$.

9. The apparatus according to claim 1, wherein the second channel delay unit is a second surface acoustic wave component, the second surface acoustic wave component comprises an input end and an output end, and a signal delay difference between the output end of the second surface acoustic wave component and the input end of the second surface acoustic wave component is the absolute delay duration $T_0$.

* * * * *